(12) United States Patent
Guthaus

(10) Patent No.: US 9,143,086 B2
(45) Date of Patent: Sep. 22, 2015

(54) POWER-EFFICIENT MULTI-FREQUENCY RESONANT CLOCK MESHES

(71) Applicant: The Regents of the University of California, Oakland, CA (US)

(72) Inventor: Matthew Guthaus, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/133,089

(22) Filed: Dec. 18, 2013

(65) Prior Publication Data

US 2014/0167868 A1 Jun. 19, 2014

Related U.S. Application Data

(60) Provisional application No. 61/738,426, filed on Dec. 18, 2012.

(51) Int. Cl.
*H01L 25/00* (2006.01)
*H03B 28/00* (2006.01)
*G01D 11/28* (2006.01)

(52) U.S. Cl.
CPC ............... *H03B 28/00* (2013.01); *G01D 11/28* (2013.01); *Y10T 29/49826* (2015.01)

(58) Field of Classification Search
USPC .................................................. 331/298, 565
See application file for complete search history.

(56) References Cited

U.S. PATENT DOCUMENTS

| 7,719,316 B2 * | 5/2010 | Chueh et al. ............ 326/93 |
| 8,339,209 B2 | 12/2012 | Papaefthymiou |
| 8,400,192 B2 | 3/2013 | Papaefthymiou |
| 2009/0027085 A1 | 1/2009 | Ishii |
| 2011/0084772 A1 | 4/2011 | Papaefthymiou |
| 2011/0090018 A1 | 4/2011 | Papaefthymiou |
| 2011/0090019 A1 | 4/2011 | Papaefthymiou |
| 2013/0154727 A1 | 6/2013 | Guthaus |

FOREIGN PATENT DOCUMENTS

| WO | WO 2005117263 | 12/2005 |
| WO | WO 2008097309 | 8/2008 |
| WO | WO2011046974 | 10/2011 |

* cited by examiner

*Primary Examiner* — Joseph Chang
(74) *Attorney, Agent, or Firm* — Adam Bell; Matthew Kaser

(57) ABSTRACT

Power-efficient resonant clock meshes and multiple frequency resonant clock distribution networks.

10 Claims, 1 Drawing Sheet

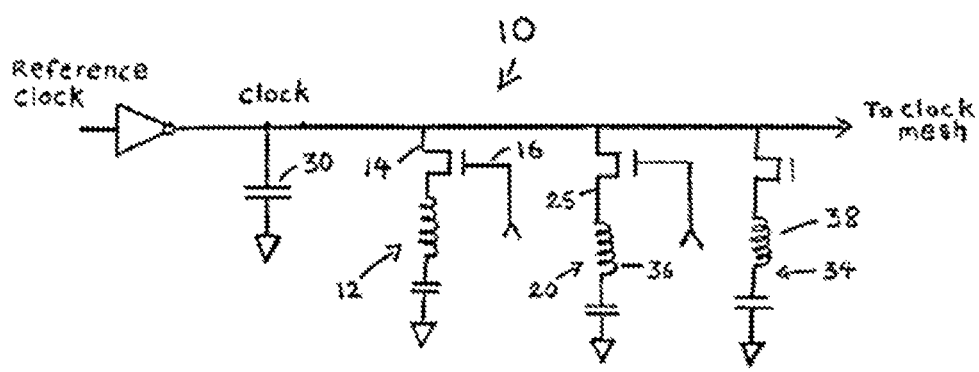

POWER-EFFICIENT MULTI-FREQUENCY RESONANT CLOCK MESHES

RELATIONSHIP TO OTHER APPLICATIONS

This application claims the benefit of and priority to U.S. provisional application No. 61/738,426 filed 18 Dec. 2012, which is hereby incorporated by reference in its entirety.

GOVERNMENT SUPPORT

This invention was made with government support under National Science Foundation grant CCF-1053838. The government has certain rights in the invention.

FIELD OF THE INVENTION

The presently disclosed subject matter is directed towards power-efficient resonant clock meshes. More particularly, the present invention is directed toward multiple frequency resonant clock distribution networks.

BACKGROUND OF THE INVENTION

The on-going demand for high performance electronic systems has driven the need for high-speed digital Very Large Scale Integration (VLSI) chips. VLSI implementations have proceeded in two inter-related directions: higher performance and higher density (more devices per unit area). While modern VLSI chips have achieved astonishingly high levels of performance and chip density, there is a very strong demand for even higher levels.

One serious impediment to achieving what is demanded from VLSI devices is power consumption. As a rule of thumb higher performance requires more power. But, more power produces more heat, which increases failure rates. Consequently, power consumption is the predominant challenge in improving modern high performance systems.

Almost all modern VLSI chips are clocked. That is, the operations of the gates within a VLSI chip are synchronized to act together by clock signals. As long as the gates can keep up, the higher the clock rate the faster the performance. Unfortunately, as clock rates and VLSI chip densities increase it becomes very difficult to ensure that all of the chips can keep up with the clocks. One reason for this is that each sequential element in a VLSI chip needs its own clock signal, but not all devices are the same distance from the clock signal source, which means that all clock lines are not the same length and that associated parameters such as distributed capacitances and resistances, differ. Different lengths coupled with unavoidable signal delays caused by distributed resistances and capacitances mean that clock signals arrive at different devices at different times (clock skew). Such can effectively limit the performance of a VLSI chip.

Compounding the clocking problems is the fact that clocking requires power. In fact, the on-chip clock distribution network (CDN) of modern VLSI chips often consumes more than 35% of the total chip power and can occasionally require as much as 70%.

Various approaches have been attempted in the prior art to address VLSI clocking problems. One approach to decreasing CDN power consumption is to use resonant clocks in the VLSI clock distribution network. For example see the following applications: U.S. App No. 61/502,619 Title: DISTRIBUTED LC RESONANT TANKS CLOCK TREE SYNTHESIS, and U.S. App No. 61/502,626 Title: DISTRIBUTED RESONANT CLOCK GRID SYNTHESIS, and U.S. App No. 61/502,635 Title: METHODS FOR INTEGRATED CIRCUIT C4 BALL PLACEMENT, inventor in all cases is Dr. Matthew Guthaus. Also see U.S. application Ser. No. 12/903,166 (US 2011/0090018 A1) that describes an inductor architecture for resonant clock distribution networks that allows for the adjustment of the natural frequency of a resonant clock distribution network, so that it achieves energy-efficient operation at multiple clock frequencies. Also see U.S. Ser. No. 12/903,168 (WO2011/046981A2) that describes an architecture allows for the energy-efficient operation of a resonant clock distribution network at multiple clock frequencies through the deployment of flip-flops that can be selectively enabled. Also see US20110090019A1, US20110090018A1, US20110084772A1, US20090027085A1, and WO2011046974A3. These applications and any publication thereof, and any and all publications referred to in this disclosure, are hereby incorporated by reference to the fullest extent allowed by law.

While resonant clock circuits have proven to be a viable way to reduce power consumption they have not been fully developed. For example, modern VLSI devices are capable of operating at multiple frequencies. One major reason for this is the desire to reduce power consumption, not only on the clock lines but on data lines. Consequently there is a need to achieve the benefits of resonance clock distribution networks and operation at multiple frequencies in the same device.

BRIEF DESCRIPTION OF THE INVENTION

The invention encompasses resonant clock meshes that resonate at multiple frequencies.

BRIEF DESCRIPTION OF THE FIGURE

FIG. 1 is a schematic depiction of a resonant clock mesh 10 in accord with the present invention.

DETAILED DESCRIPTION OF THE INVENTION

The invention encompasses resonant clock meshes that resonate at multiple frequencies.

Dynamic frequency scaling is a common technique to save power in both the clock network and in data-path logic on computer chips since the power is proportional to $CV^2f$ where C is capacitance, V is the supply voltage and f is the frequency of operation. While prior resonant clock networks can save power by recycling energy in the clock network, they do not save any power in the data-path logic. Prior resonant clocks only work at a single resonant frequency.

Referring to FIG. 1, the present invention solves this problem by creating a resonant clock mesh 10 that can resonate at multiple frequencies. The basic concept uses inductor-capacitor (LC) tanks 12, 20, and 38 that are selectively attached to the clock mesh through NMOS pass transistors. The gate of each transistor controls when the LC tank is electrically attached or when it is not attached to the clock mesh.

Similarly the clock mesh is also driven by a tri-state clock driver 18 that can be enabled or disabled. The clock driver 18 must be capable of being disabled in order to save power. When all LC tanks 12, 20 or 38 are disabled the clock driver 18 must is in "buffered mode" and the driver 18 must be enabled to drive the clock mesh. While this is the most power efficient mode because it is non-resident, it is also the most flexible as it can be driven at any frequency by the driver 18.

In the resonant modes, the resonant frequency is determined by how many LC tanks 12, 20, 38 are enabled. The resonant frequency of a clock mesh is determined by 1/sqrt (LCg) where Cg 30 is the fixed capacitance of the clock grid. For example, assume that Cg 30 is 5 pF. The key observation is that at low frequencies the parasitic resistance of the clock mesh is not very large and a single LC tank 12 can resonate the entire clock grid. For example, a 5 nH inductor will produce a 1 GHz resonant clock. If two additional LC tanks 20 and 38 with 5 nH inductances 36 and 38, respectively are switched on in parallel, this provides an effective 1.6 nH inductance (Leff=1/(1/L+1/L2+1/L3)) and will produce a 1.75 GHz resonant clock. Switching on 4 more 5 nH inductors (7 total) in parallel will produce a 0.71 nH effective inductance and resonate at 2.67 Ghz.

In summary, the above technique enables multiple resonant clock modes for a 5 pF clock mesh:
1) Low-speed (1 GHz): A single (e.g. 5 nH) LC tank is attached to the center of the clock mesh.
2) Medium-speed (1.75 GHz): Two additional (e.g. 5 nH) LC tanks are attached in each half of the clock mesh while the los-speed tank is enabled.
3) High-speed (2.67 GHz): Four more (e.g. 5 nH) LC tanks are attached in addition to the previous three LC tanks.

The C in the LC tank is always assumed to enable a secondary resonant frequency and is sized much larger than Cg/n in each case where n is the number of enabled LC tanks.

In general the number of inductor-capacitor tanks can be much larger depending on the desired clock speed and the clock mesh capacitance. The size of the inductor in the LC tank is also not restricted to be 5 nH and can be selected for finer granularity frequency scaling. However, as the frequency goes up, the parasitic resistance becomes more important and the LC tanks must be distributed throughout the clock mesh.

The invention claimed is:

1. An integrated circuit, comprising:
a clocked input
a resonant clock mesh line;
a driver operatively connecting said clocked input to said resonant clock mesh line;
a first inductor-capacitor resonant network;
a second inductor-capacitor resonant network;
a first electronic switch for selectively connecting said first inductor-capacitor resonant network to said resonant clock mesh line; and
a second electronic switch for selectively connecting said second inductor-capacitor resonant network to said resonant clock mesh line.

2. The integrated circuit of claim 1, wherein said first inductor-capacitor resonant network resonates at a first frequency, said second inductor-capacitor resonant network resonates at a second frequency, and wherein said first inductor-capacitor resonant network and said second inductor-capacitor resonant network resonate at a third frequency when connected to said resonant clock mesh line.

3. The integrated circuit of claim 1, wherein said driver is a tri-state clock driver that can be selectively disabled.

4. A resonant clock mesh that resonates at multiple frequencies comprising a first inductor-capacitor (LC) tank and a first NMOS pass transistor wherein the gate of the first NMOS pass transistor controls when the first LC tank is electrically attached a clock mesh line; and
a second inductor-capacitor (LC) tank and a second NMOS pass transistor wherein the gate of the second NMOS pass transistor controls when the second LC tank is electrically connected to the clock mesh line.

5. The resonant clock mesh of claim 4 wherein the clock mesh line is driven by a tri-state clock driver that can be disabled to save power.

6. The resonant clock mesh of claim 5 capable of multiple resonant clock modes for a 5 pF clock mesh, including:
(i) low-speed (1 GHz) wherein a single LC tank is attached to the center of the clock mesh;
(ii) medium-speed (1.75 GHz) wherein two additional LC tanks are attached in each half of the clock mesh while a loss-speed tank is enabled; and
(iii) high-speed (2.67 GHz) wherein four more LC tanks are attached in addition to the previous three LC tanks.

7. An integrated circuit, comprising:
a clock input;
a resonant clock mesh line;
a driver selectively connecting said clock input to said resonant clock mesh line;
a first inductor-capacitor resonant network;
a second inductor-capacitor resonant network;
a third inductor-capacitor resonant network;
a first electronic switch for selectively connecting said first inductor-capacitor resonant network to said resonant clock mesh line;
a second electronic switch for selectively connecting said second inductor-capacitor resonant network to said resonant clock mesh line; and
a third electronic switch for selectively connecting said second inductor-capacitor resonant network to said resonant clock mesh line.

8. The integrated circuit according to claim 7, where said driver is a tri-state driver.

9. The integrated circuit according to claim 8, where said tri-state driver is an inverter.

10. The integrated circuit according to claim 7, where said a first electronic switch is an NMOS pass transistor.

* * * * *